United States Patent
Herner

(10) Patent No.: US 7,811,916 B2
(45) Date of Patent: Oct. 12, 2010

(54) METHOD FOR ISOTROPIC DOPING OF A NON-PLANAR SURFACE EXPOSED IN A VOID

(75) Inventor: S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 585 days.

(21) Appl. No.: 11/610,090

(22) Filed: Dec. 13, 2006

(65) Prior Publication Data

US 2008/0145994 A1    Jun. 19, 2008

(51) Int. Cl.
*H01L 21/223* (2006.01)
*H01L 21/383* (2006.01)

(52) U.S. Cl. ............. 438/565; 438/513; 257/E21.141; 257/E21.143

(58) Field of Classification Search .......... 438/513, 438/565; 257/E21.585, E21.586, E21.141, 257/E21.143
See application file for complete search history.

(56) References Cited

U.S. PATENT DOCUMENTS

| | | | |
|---|---|---|---|
| 5,915,167 A | 6/1999 | Leedy | |
| 6,952,030 B2 | 10/2005 | Herner | |
| 7,172,840 B2 | 2/2007 | Chen | |
| 7,575,984 B2 | 8/2009 | Radigan et al. | |
| 2004/0266206 A1* | 12/2004 | Cleeves | 438/719 |
| 2005/0052915 A1 | 3/2005 | Herner | |
| 2005/0098800 A1* | 5/2005 | Herner et al. | 257/209 |
| 2005/0118776 A1* | 6/2005 | Hsu | 438/386 |
| 2005/0221200 A1 | 10/2005 | Chen | |
| 2005/0226067 A1 | 10/2005 | Herner | |
| 2006/0006495 A1* | 1/2006 | Herner et al. | 257/530 |
| 2006/0054962 A1* | 3/2006 | Dunton et al. | 257/313 |
| 2008/0003793 A1 | 1/2008 | Herner et al. | |

* cited by examiner

*Primary Examiner*—David Vu
*Assistant Examiner*—Earl N Taylor
(74) *Attorney, Agent, or Firm*—Dugan & Dugan, PC

(57) ABSTRACT

A method is described for isotropic or nearly isotropic shallow doping of a non-planar surface exposed in a void. The results of ion implantation, a common doping method, are inherently planar. Some fabrication methods and devices may require doping a surface of a non-planar feature exposed in a void, such as a trench. The feature is doped by flowing a gas which will provide the dopant over the exposed surfaces, or by exposing the surfaces to a plasma including the dopant. The feature may be a patterned feature, including a top surface and a sidewall. In a preferred embodiment, a semiconductor feature having a top surface and a sidewall is exposed in a trench formed in a dielectric, and a gas providing a p-type or n-type dopant is flowed in the trench, providing a p-type or n-type dopant to the semiconductor.

31 Claims, 4 Drawing Sheets

Embodiment of 6,952,030

METHOD FOR ISOTROPIC DOPING OF A NON-PLANAR SURFACE EXPOSED IN A VOID

BACKGROUND OF THE INVENTION

In the formation of semiconductor devices, there may be a need to incorporate small amounts of some other material, which will be called a dopant, into a solid layer or feature. Semiconductor materials, most commonly silicon, are routinely doped with p-type or n-type dopants to enhance conductivity.

Shallow doping is often achieved by ion implantation, in which dopant ions are accelerated into a layer of a semiconductor such as silicon. For example, boron or phosphorus ions may be implanted into silicon to dope it. Since the ions are implanted at a given implantation energy, this method is best adapted to dope a planar region of a planar surface.

In some devices, however, it may be may be necessary to dope a surface which is not planar, forming a non-planar doped region. It would be advantageous to dope a non-planar surface in an isotropic or nearly-isotropic manner.

SUMMARY OF THE PREFERRED EMBODIMENTS

The present invention is defined by the following claims, and nothing in this section should be taken as a limitation on those claims. In general, the invention is directed to a method to form a non-planar doped region at a surface.

A first aspect of the invention provides for a method for providing a dopant, the method comprising: forming a feature having a top surface and a sidewall; depositing first dielectric material to cover the feature; etching a void in the first dielectric material, wherein a portion of the top surface and a portion of the sidewall of the feature are exposed in the void; and either a) flowing a dopant gas over the exposed top surface portion and the exposed sidewall portion or b) exposing the exposed top surface portion and the exposed sidewall portion to a plasma containing the dopant gas.

Another preferred embodiment of the invention provides for a method for forming a monolithic three dimensional memory array, the method comprising: a) monolithically forming a first memory level above a substrate by a method comprising: i) forming a plurality of first features, each first feature having a top surface and a sidewall; ii) depositing first dielectric material to cover the first features; iii) etching a plurality of voids in the first dielectric material, wherein a portion of the top surface and a portion of the sidewall of one of the first features are exposed in each of the voids; and iv) either a) flowing a dopant gas over the exposed top surface portion and the exposed sidewall portion of each first feature or b) exposing the exposed top surface portion and the exposed sidewall portion of each first feature to a plasma containing the dopant gas; and b) monolithically forming a second memory level above the first memory level.

Still another embodiment of the invention provides for a method for doping a top heavily doped region of a semiconductor junction diode, the method comprising: forming a vertically oriented semiconductor pillar comprising an intrinsic or lightly doped region, the pillar having a top surface and a sidewall; depositing dielectric material to cover the pillar; etching a void in the dielectric material to expose a portion of the top surface and a portion of the sidewall; either a) flowing a dopant gas over the exposed top surface portion and the exposed sidewall portion or b) exposing the exposed top surface portion and the exposed sidewall portion to a plasma containing the dopant gas.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
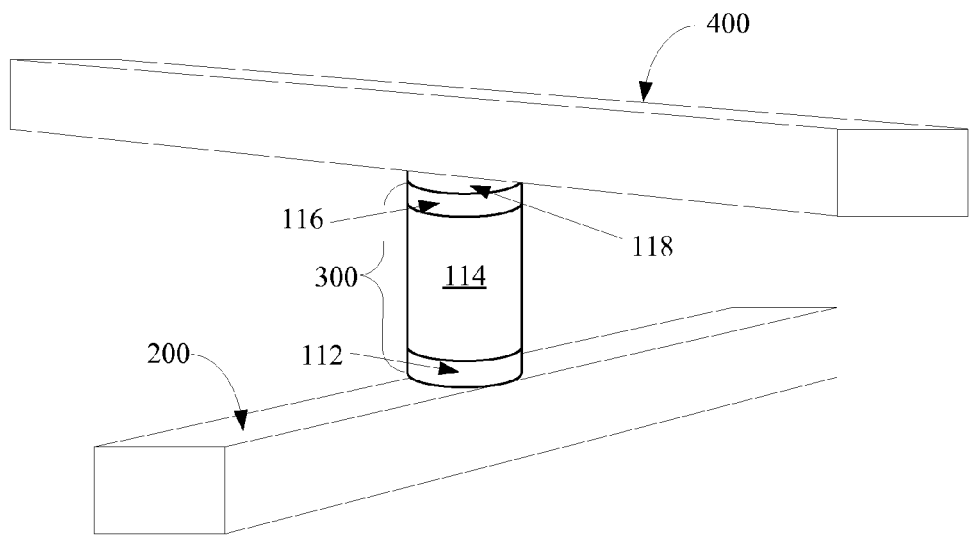
FIG. 1 is a perspective view of the memory cell of U.S. Pat. No. 6,952,030.

Herner et al., "High-Density Three-Dimensional Memory Cell," U.S. Pat. No. 6,952,030, owned by the assignee of the present invention, hereinafter the '030 patent and hereby incorporated by reference, describes a memory array in which each memory cell includes a vertically oriented p-i-n diode like the one shown in FIG. 1. This diode 300 is vertically disposed between a bottom conductor 200 and a top conductor 400, and includes a bottom heavily doped n-type region 112, a middle intrinsic region 114, and a top heavily doped p-type region 116. The silicon of diode 300 preferably is deposited amorphous and then crystallized to form a polycrystalline silicon or polysilicon diode. In some embodiments, bottom heavily doped n-type region 112 is doped by in situ doping, and top heavily doped p-type region 116 is doped by ion implantation. In other embodiments the polarity of the diode could be reversed, with the p-type region on the bottom and the n-type region on the top.

In its initial state, when a read voltage is applied between top conductor 400 and bottom conductor 200, very little current flows. After application of a larger programming voltage, the memory cell is altered, and when the same read voltage is applied between top conductor 400 and bottom conductor 200, a substantially larger current flows. In this way a programmed cell (a data "1", for example) can be distinguished from an unprogrammed cell (a data "0"). In the unprogrammed cell, current flow is impeded in part by the presence of layer 118, which is a dielectric rupture antifuse, for example a silicon dioxide layer.

Further, as described in Herner et al., U.S. patent application Ser. No. 10/955,549, "Nonvolatile Memory Cell Without a Dielectric Antifuse Having High- and Low-Impedance States," filed Sep. 29, 2004 and hereinafter the '549 application; and in Herner et al., U.S. patent application Ser. No. 11/148,530, "Nonvolatile Memory Cell Operating by Increasing Order in Polycrystalline Semiconductor Material," filed Jun. 8, 2005, hereinafter the '530 application, both owned by the assignee of the present invention and hereby incorporated by reference, the polysilicon of diode 300 of FIG. 1 is formed in a low-resistivity state, and diode 300 is a poor diode, with very low forward current under applied voltage. Application of a programming voltage ruptures dielectric rupture antifuse layer 118 and changes the nature of the polysilicon making up diode 300, causing it to become low resistivity, and greatly improving performance of the diode.

Figure 2:
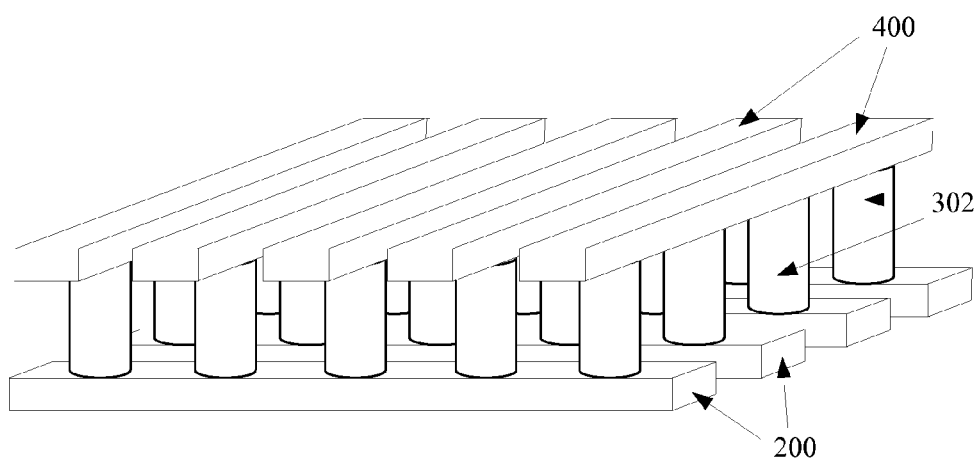
FIG. 2 is a perspective view of a memory level comprising memory cells.

A plurality of such cells can be formed in a first memory level shown in FIG. 2. Such a memory level can be formed above a substrate such as monocrystalline silicon, and additional memory levels formed above the first memory level.

In preferred embodiments of the '030 patent, bottom conductor 200, diode 300, and top conductor 400 are formed subtractively. In a subtractive process, to form bottom conductors, conductive layers are deposited, then these layers are patterned and etched to form the bottom conductors. A dielectric material is deposited between and covering the bottom conductors, then a planarization step removes overfill of dielectric fill, exposing top surfaces of the bottom conductors at a planarized surface.

A barrier layer is deposited on the planarized surface, followed by a bottom heavily doped n-type silicon layer, which is in situ doped. The remaining thickness of silicon is deposited undoped. The intrinsic and doped silicon layers are patterned and etched to form pillars. Gaps between the pillars are filled with dielectric material. A planarization step removes any dielectric overfill and exposes the tops of pillars at a planarized surface. Ion implantation is performed at this point to form top heavily doped p-type regions. In some embodiments an optional dielectric rupture antifuse layer is formed at this point. This antifuse layer may be a thermally grown silicon dioxide layer.

Conductive material is deposited on this planarized surface, and a pattern and etch step forms top conductors, which preferably extend perpendicular to bottom conductors. Gaps between top conductors are filled with dielectric material.

In some embodiments it may be preferred to form the top or bottom conductors using a Damascene rather than a subtractive method. To form a conductor using a Damascene method, a trench is etched in a dielectric layer. Conductive material is deposited to fill the trench, and a planarizing step removes overfill of conductive material to complete the conductor.

Figure 3A:
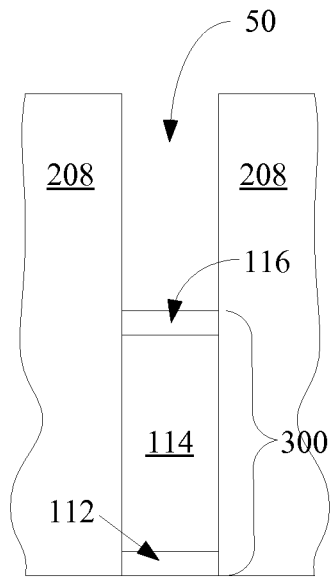
FIG. 3a is a cross-sectional view illustrating etching a trench to contact an underlying pillar with perfect alignment.

A difficulty arises when Damascene construction is used to form the top conductors in a memory array of cells like the memory cell shown in FIG. 1a. FIG. 3a shows a diode 300 covered by dielectric fill 208. A trench 50 is etched into dielectric fill 208. With perfect alignment, the trench contacts heavily doped p-type region 116 at the top of diode 300. A top conductor can be formed in trench 50.

Figure 3B:
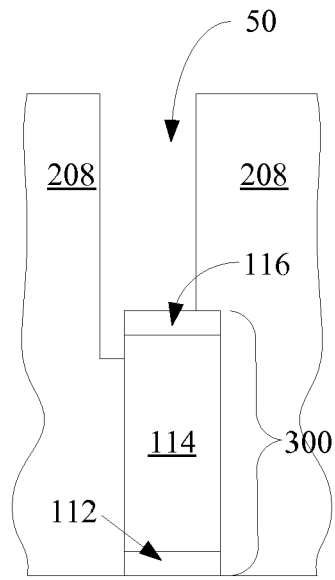
FIG. 3b is a cross-sectional view illustrating etching a trench to contact an underlying pillar with overetch due to misalignment when the methods of the present invention are not used.

In reality, however, there will nearly always be some misalignment. As shown in FIG. 3b, if trench 50 is misaligned to diode 300, some overetch will occur, exposing a portion of the sidewall of pillar 300. In preferred embodiments top p-type region 116 is very thin. Thus if the depth of overetch exceeds the thickness of top p-type region 116, as shown, a portion of a conductor formed in trench 50 may contact intrinsic region 114 as well as p-type region 116. If a dielectric rupture antifuse is formed at the top of pillar 300, the conductive rupture region formed when the antifuse is ruptured may form in this region, allowing electrical contact between the top conductor and intrinsic region 114. This contact degrades the device.

It is known to perform ion implantation at an angle to the wafer surface, rather than perpendicular to it. An angled implant will not solve the problem shown in FIG. 4b, however. An angled implant cannot practically be performed to dope a feature at the bottom of a trench. In addition, an angled implant is typically aimed at a flat surface, such as the sidewall of a gate. Because of their small size, the pillars 300 of the memory cell shown in FIG. 1 tend to be rounded, having a substantially cylindrical shape. An angled implant cannot practically be used to uniformly dope a curved sidewall.

Figure 4A:
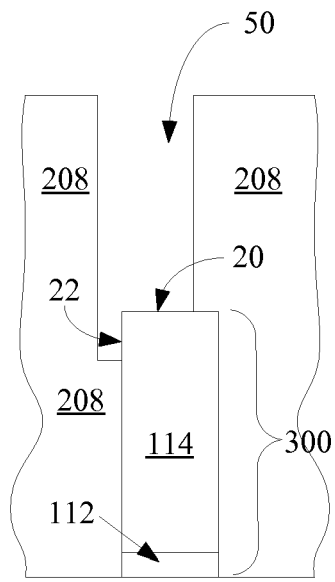
FIGS. 4a and 4b are cross-sectional views illustrating an embodiment of the present invention.

In the present invention, an isotropic or nearly-isotropic method is used to provide dopant to all surfaces exposed in a trench. Turning to FIG. 4a, in this embodiment the heavily doped p-type region 116 of pillar 300 has not yet been formed, and the pillar includes only bottom heavily doped n-type region 112 and intrinsic or lightly doped region 114. After formation of trench 50, the exposed top surface 20 and sidewall 22 of pillar 300 are exposed to a dopant gas which will provide an n-type or p-type dopant. Appropriate n-type or p-type dopants include phosphorus, boron, arsenic, indium, gallium, or aluminum. Some dopant gases which may advantageously be used are, for example, $PH_3$, $POCl_3$, $BCl_3$, $B_2H_6$, $AsH_3$, $GaCl$, $GaCl_3$, $Ga(CH_3)_3$, $Al(CH_3)_3$, or $In(H_3)_3$. The dopant gas may be diluted with an inert gas such as helium or nitrogen to improve mixing, and should be provided at an elevated temperature, for example 300 degrees C. or greater.

Figure 4B:
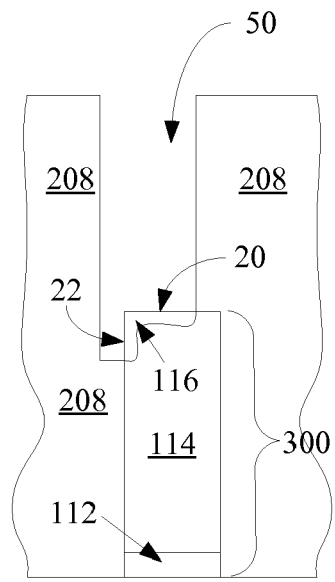

Referring to FIG. 4b, in this way dopant atoms are provided to the entire exposed surface, both to the top surface 20 of pillar 300 and to the exposed portion of the sidewall 22. In the example given, p-type dopant atoms diffuse into the semiconductor material of pillar 300, forming heavily doped p-type region 116 and completing the diode. This isotropic doping method allows a non-planar surface to be doped. The dopant provided in this way can, as in the example of FIG. 4b, form a heavily doped semiconductor region. Intrinsic polysilicon, as in region 114, will never be perfectly electrically neutral, and in general has defects which cause it to behave as if slightly n-doped. The boundary of heavily region 116 in FIG. 4b thus forms a p-n junction. In other embodiments, the dopant provided by methods of the present invention may form an ohmic contact between an adjacent conductor and the semiconductor region.

In an alternative embodiment, the surface of intrinsic silicon region 114 can be exposed to a plasma containing one of these dopant gases. A plasma is formed between planar surfaces, and thus a plasma process is to some degree directional and not perfectly isotropic. Nonetheless, exposing a non-planar surface to plasma including a gas like one of the named dopant gases can be effective in providing a dopant to a non-planar surface in accordance with embodiments of the present invention.

After doping is completed, a top rail-shaped conductor is formed in the trench, completing a memory cell. The memory cell comprises a portion of a bottom rail-shaped conductor (formed below the memory cell, not shown in FIG. 4b), the pillar comprising the diode, and a portion of the rail-shaped top conductor.

The examples provided thus far show a semiconductor pillar, its exposed top and sidewall surfaces doped by n- or p-type dopants in a trench formed in dielectric before formation of a conductor. As will be appreciated by those skilled in the art, however, many other embodiments fall within the scope of the invention. Aspects of the invention will be useful in any situation in which a non-planar surface to be doped is exposed in a void. The void may be a hole (in which a conductive plug is formed) rather than a trench, for example. In the example given, the feature having the exposed surface to be doped is in the form of a pillar, but in other embodiments this feature can be any non-planar shape or surface. Any patterned feature having a sidewall in which the sidewall is exposed in a void, for example, can be doped using methods of the present invention. The example provided showed doping of semiconductor material with p-type or n-type dopants, where the dopant gas or plasma provides the n-type or p-type dopant, but surface doping of any solid with any dopant can be performed according to aspects of the present invention. In the example given a p-i-n diode was formed, but devices, including other types of semiconductor junction diodes, can be formed. The term "junction diode" is used herein to describe a semiconductor device with the property of conducting current more easily in one direction than the other, having two terminal electrodes, and made of semiconducting material which is p-type at one electrode and n-type at the other. Examples include p-n diodes, which have p-type semiconductor material and n-type semiconductor material in contact, and p-i-n, in which intrinsic (undoped) semiconductor material is interposed between p-type semiconductor material and n-type semiconductor material.

Aspects of the present invention, then, include forming a feature having a top surface and a sidewall; depositing first dielectric material to cover the feature; etching a void in the first dielectric material, wherein a portion of the top surface and a portion of the sidewall of the feature are exposed in the void; and either a) flowing a dopant gas over the exposed top surface portion and the exposed sidewall portion or b) exposing the exposed top surface portion and the exposed sidewall portion to a plasma containing the dopant gas. If the dopant is provided by flowing a dopant gas, the temperature during the flowing step is preferably over about 300 degrees C. The feature may comprise semiconductor material, or any other material.

A detailed example will be provided of formation of a monolithic three dimensional memory array formed according to a preferred embodiment of the present invention. For completeness, specific process conditions, dimensions, methods, and materials will be provided. It will be understood, however, that such details are not intended to be limiting, and that many of these details can be modified, omitted or augmented while the results still fall within the scope of the invention. For example, some details from the '030 patent may be useful, as may details from the '549 and '530 applications; as well as details from Herner et al., U.S. patent application Ser. No. 11/478,706, "Ultrashallow Semiconductor Contact By Outdiffusion from a Solid Source," filed Jun. 30, 2006; and Radigan et al., U.S. patent application Ser. No. 11/444,936, "Conductive Hard Mask to Protect Patterned Features During Trench Etch," filed May 31, 2006, both owned by the assignee of the present invention and hereby incorporated by reference. To avoid obscuring the invention, all details from this patent and these applications have not been included, but it will be understood that no relevant teaching is intended to be excluded.

EXAMPLE

Figure 5A:
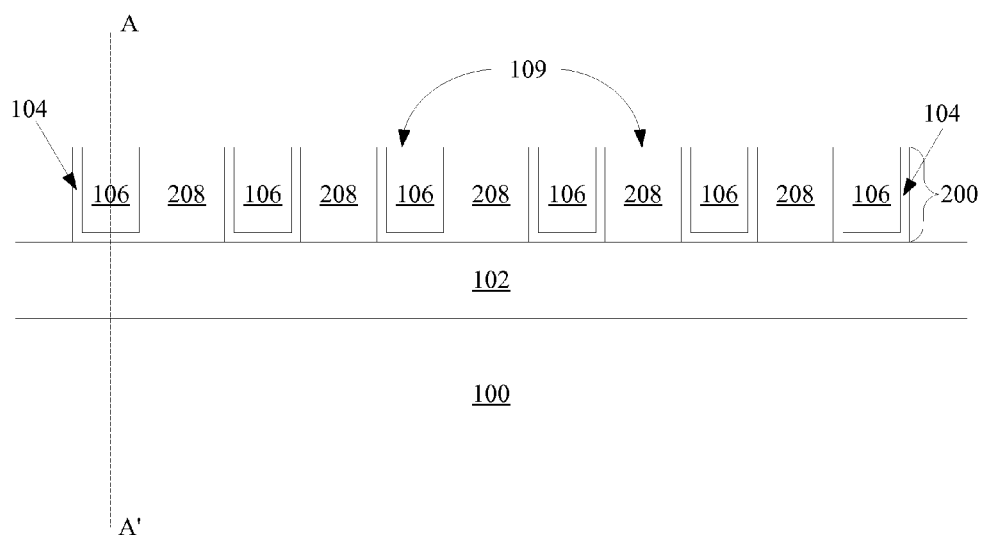
FIGS. 5a-5d are cross-sectional views illustrating stages in formation of a monolithic three dimensional memory array formed according to a preferred embodiment of the present invention.

Turning to FIG. 5a, formation of the memory begins with a substrate 100. This substrate 100 can be any semiconducting substrate known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, Si—C—O—H film, or any other suitable insulating material.

The first conductors 200 are formed over the substrate and insulator. First conductors 200 are preferably formed by a Damascene method, but may be formed subtractively instead.

To form Damascene conductors, a thickness of dielectric material 208, preferably between about 1500 and about 3500 angstroms, for example about 3000 angstroms, is deposited. Dielectric material 208 is preferably a uniform dielectric such as tetraethyl orthosilicate (TEOS).

Substantially parallel trenches are etched in dielectric 208. In one embodiment, these trenches are about 3000 angstroms deep. This etch may be timed, or, if desired, may stop on a previously deposited etch stop layer (not shown.)

The pitch and feature size of the conductors may be as desired, for example less than about 200 nm, for example between about 160 nm and about 90 nm. Trenches 208 may be less than about 100 nm wide, for example between about 80 and about 45 nm wide.

Any appropriate conductive material can be used to form conductors 200, such as a metal, metal alloy, conductive metal silicide, heavily doped silicon, etc. In a preferred embodiment, an adhesion layer 104, for example of titanium nitride, is deposited. Layer 104 may be between about 50 and about 400 angstroms thick, preferably about 100 angstroms thick. A conductive material 106, preferably tungsten or a tungsten alloy, is deposited to fill the trenches etched in dielectric 208. If some material other than tungsten is used, adhesion layer 104 may not be required.

Finally, excess tungsten and titanium nitride is removed, forming conductor rails 200 separated by dielectric material 208, and leaving a substantially planar surface 109. The resulting structure is shown in FIG. 5a. This removal of dielectric overfill to form planar surface 109 can be performed by any process known in the art, such as CMP or etchback. Some thickness of dielectric 208 will be removed during this CMP step; thus the final height of conductor rails 200 may be somewhat less than the initial thickness of dielectric layer 208 and the original depth of trenches; for example the height of conductor rails 200 may be about 2500 angstroms.

Figure 5B:
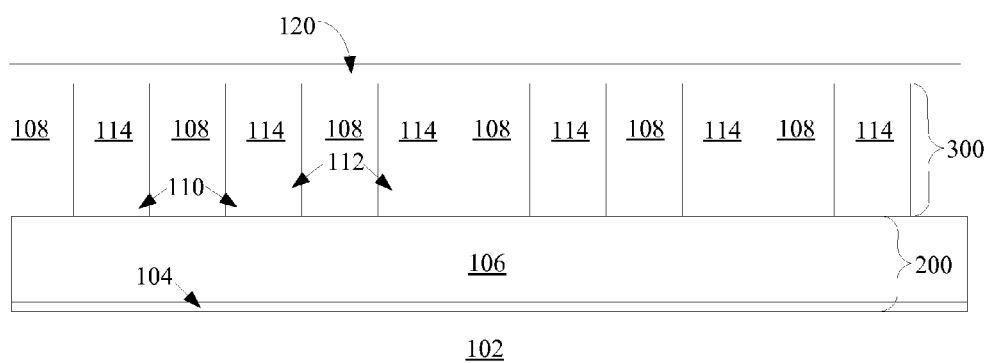

Next, turning to FIG. 5b, vertical pillars will be formed above completed conductor rails 200. FIG. 5b is rotated 90 degrees relative to FIG. 5a along line A-A' of FIG. 5a; in FIG. 5a conductors 200 extended out of the page, while in FIG. 5b they extend left-to-right across the page. (To save space substrate 100 is omitted in FIG. 5b and subsequent figures; its presence will be assumed.) If tungsten was used for conductive layer 106, it is preferred to use a barrier layer 110 between the lower conductor rails 200 and the semiconductor material to be deposited. Barrier layer 110 is deposited on substantially planar surface 109. This layer can be any appropriate conductive barrier material, for example titanium nitride, with any appropriate thickness, for example 50 to 200 angstroms, preferably 100 angstroms.

Next semiconductor material that will be patterned into pillars is deposited. The semiconductor material can be silicon, germanium, a silicon-germanium alloy, or other suitable semiconductors, or silicon or germanium alloys. For simplicity, this description will refer to the semiconductor material as silicon, but it will be understood that the skilled practitioner may select any of these other suitable materials instead.

Bottom heavily doped region 112 can be formed by any deposition and doping method known in the art. The silicon can be deposited and then doped, but is preferably doped in situ by flowing a dopant gas providing n-type dopant atoms, for example phosphorus, during deposition of the silicon. Heavily doped region 112 is preferably between about 100 and about 800 angstroms thick.

Intrinsic region 114 can be formed by any method known in the art. Region 114 preferably has a thickness between about 1100 and about 3300 angstroms, most preferably about 2000 angstroms. The silicon of heavily doped region 112 and intrinsic region 114 is preferably amorphous as deposited.

Semiconductor regions 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

Pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide deposited by high-density plasma (HDP) is used as the insulating material.

Next the dielectric material on top of pillars 300 is removed, exposing the tops of pillars 300 separated by dielectric material 108, and leaving a substantially planar surface. This removal of dielectric overfill can be performed by any process known in the art, such as CMP or etchback.

In preferred embodiments an etch stop layer 120 is deposited on the substantially planar surface. Etch stop layer 120 is preferably a dielectric layer having good etch selectivity to the next dielectric layer to be deposited, which will preferably be silicon dioxide. An advantageous choice for etch stop layer 120 is silicon nitride. The thickness of this layer is preferably between about 100 and about 2000 angstroms thick, preferably about 400 angstroms thick. Use of etch stop layer 120 is preferred, but in some embodiments this layer can be omitted. The structure at this point is shown in FIG. 5b.

Figure 5C:
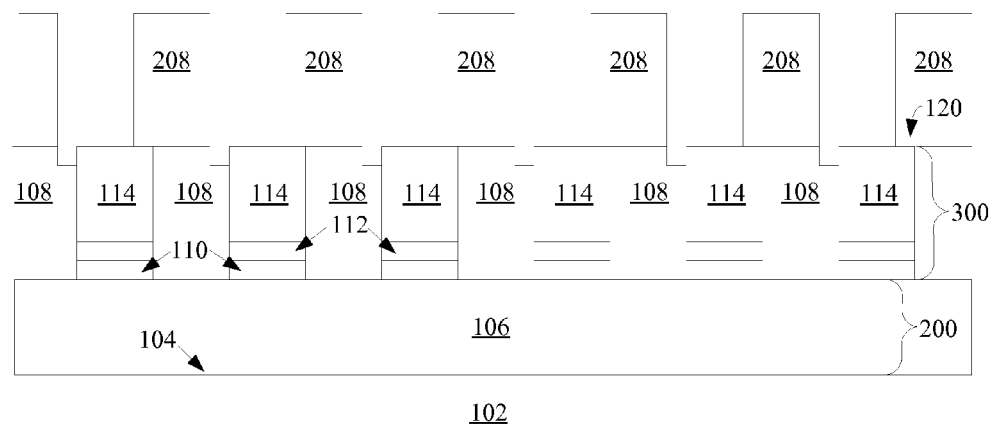

Turning to FIG. 5c, a thickness of dielectric material 208, preferably between about 1500 and about 3500 angstroms, for example about 3000 angstroms, is deposited. Dielectric material 208 is preferably a uniform dielectric such as TEOS.

Substantially parallel trenches are etched in dielectric 208. In one embodiment, these trenches are about 3000 angstroms deep. If etch stop layer 120 has been included, the etch will stop on layer 120. A second etch step etches through etch stop layer 120. In case of misalignment, as shown, a small amount of overetch, for example 200 to 500 angstroms may be expected, exposing sidewalls 22 of pillars 300.

If etch stop layer 120 has not been included, the etch to form trenches in layer 208 is preferably a timed etch. A larger overetch should be expected in this case.

The trenches in dielectric 208, in which top conductors 400 will be formed, should extend in a second direction different from the direction of bottom conductors 200, preferably substantially perpendicular to them. These trenches (and top conductors 400) should have the same pitch as underlying pillars 300, such that each pillar 300 is vertically disposed between one of bottom conductors 200 and one of top conductors 400. This pitch is preferably between about 90 nm and about 200 nm, for example about 160 nm.

After trenches are etched, any native oxide is removed with a brief HF dip, for example 20 seconds in a 100:1 solution, which is preferably performed no more than four hours prior to doping.

Figure 5D:
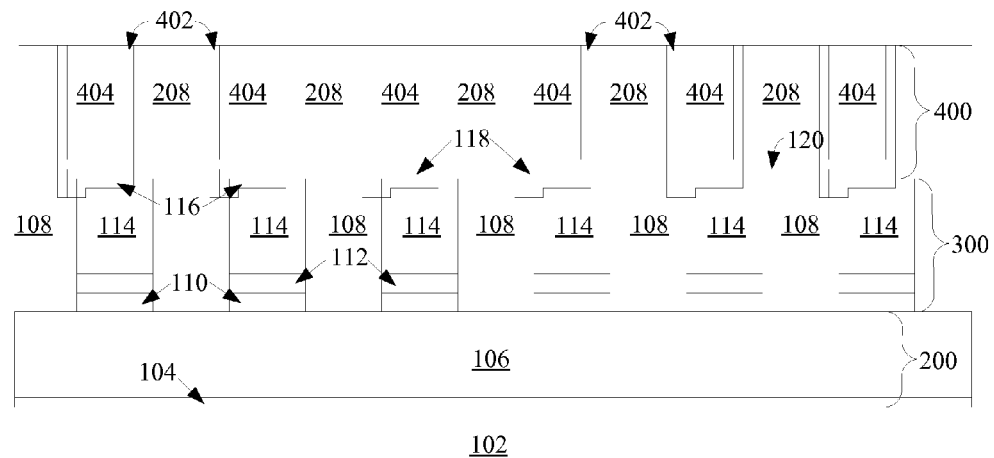

Turning to FIG. 5d, in preferred embodiments a dopant gas which will provide a p-type dopant is flowed, such as $BCl_3$, $B_2H_6$, GaCl, $GaCl_3$, $Ga(CH_3)_3$, $Al(CH_3)_3$, or $In(H_3)_3$. In a preferred embodiment, vapor phase doping is accomplished at a pressure of about 400 mTorr, at a temperature between about 500 and about 700 degrees C., preferably between about 540 and about 600 degrees C., with a flow of, for example, about 100 sccm 1.5% $BCl_3$ (diluted in an inert gas such as He) and 600 sccm of He. The dopant gas may be flowed, for example, for about five minutes.

In alternative embodiments in which the top heavily doped region of pillars 300 is to be doped with an n-type dopant, preferred dopant gases include $PH_3$, $POCl_3$, or $AsH_3$.

In alternative embodiments, doping may be achieved by exposing the wafers to a plasma including $BCl_3$, $B_2H_6$, GaCl, $GaCl_3$, $Ga(CH_3)_3$, $Al(CH_3)_3$, or $In(H_3)_3$.

Note that the semiconductor material of pillars 300 is preferably amorphous at this point. In the present example, this doping step forms top heavily doped p-type region 116. After completion of doping, a dielectric rupture antifuse layer 118 may be thermally grown on the exposed top surface and sidewall of each pillar 300. In some embodiments dielectric rupture antifuse layer 118 may be omitted.

Any appropriate conductive material can be used to form conductors top 400. In a preferred embodiment, an adhesion layer 402, for example of titanium nitride, is deposited. Layer 402 may be between about 100 and about 400 angstroms thick, preferably about 100 angstroms thick. A conductive material 404, preferably tungsten, is deposited to fill the trenches in dielectric material 208. If some material other than tungsten is used, adhesion layer 402 may not be required.

Finally, excess tungsten and titanium nitride is removed, forming top conductor rails 400 separated by dielectric material 208, and leaving a substantially planar surface. This removal of dielectric overfill to form a planar surface can be performed by any process known in the art, such as chemical mechanical planarization (CMP) or etchback. The resulting structure, shown in FIG. 5d, is a bottom or first story of memory cells.

Formation of a first memory level has been described. Additional memory levels can be monolithically formed above this first memory level to form a monolithic three dimensional memory array.

In preferred embodiments, the semiconductor material forming the diodes is amorphous as deposited. Preferably after all of the memory levels have been formed, a single crystallizing anneal is performed to crystallize the p-i-n diodes in each memory level, for example at 750 degrees C. for about 60 seconds, though, in an alternative embodiment, each memory level can be annealed as it is formed. The resulting diodes will generally be polycrystalline.

In some embodiments, conductors can be shared between memory levels; i.e. top conductor 400 would serve as the bottom conductor of the next memory level above. In other embodiments, an interlevel dielectric (not shown) is formed above the first memory level of FIG. 5d, its surface planarized, and construction of a second memory level begins on this planarized interlevel dielectric, with no shared conductors.

A monolithic three dimensional memory array, then, can be formed by monolithically forming a first memory level above a substrate (such as a wafer), then monolithically forming a least a second memory level above the first. The first memory level is formed by i) forming a plurality of first features, each first feature having a top surface and a sidewall; ii) depositing first dielectric material to cover the first features; iii) etching a plurality of voids in the first dielectric material, wherein a portion of the top surface and a portion of the sidewall of one of the first features are exposed in each of the voids; and iv) either a) flowing a dopant gas over the exposed top surface portion and the exposed sidewall portion of each first feature or b) exposing the exposed top surface portion and the exposed sidewall portion of each first feature to a plasma containing the dopant gas. In this embodiment, the dopant gas provides an n-type or p-type dopant. In the example described, the first features are pillars, and each pillar comprises a top heavily doped region doped by the n-type or p-type dopant.

The first memory level comprises a plurality of rail-shaped bottom conductors below the first pillars. Each rail-shaped top conductor is formed in one of the voids, which may be trenches. The first memory level comprises a plurality of first memory cells, each first memory cell comprising one of the pillars, a portion of one of the bottom conductors, and a portion of one of the top conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for providing a dopant, the method comprising:
    forming a feature having a top surface and a sidewall;
    depositing first dielectric material to cover the feature;
    etching a void in the first dielectric material, wherein a portion of the top surface and a portion of the sidewall of the feature are exposed in the void; and
    either a) flowing a dopant gas over the exposed top surface portion and the exposed sidewall portion or b) exposing the exposed top surface portion and the exposed sidewall portion to a plasma containing the dopant gas.

2. The method of claim 1 wherein the feature comprises semiconductor material.

3. The method of claim 2 wherein the semiconductor material is silicon, germanium, or an alloy of silicon and/or germanium.

4. The method of claim 3 wherein the feature is in the form of a pillar.

5. The method of claim 4 wherein the dopant gas provides an n-type or p-type dopant, and wherein the pillar comprises a top heavily doped region doped by the n-type or p-type dopant, the top heavily doped region having a first conductivity type.

6. The method of claim 5 wherein the pillar further comprises a bottom heavily doped region.

7. The method of claim 6 wherein the bottom heavily doped region has a second conductivity type opposite the first conductivity type.

8. The method of claim 7 wherein the pillar comprises a vertically oriented semiconductor junction diode.

9. The method of claim 8 wherein the diode is a p-i-n diode.

10. The method of claim 9 wherein the void is a hole, and further comprising forming a conductive plug within the hole.

11. The method of claim 9 wherein the void is a trench, and further comprising forming a rail-shaped top conductor within the trench.

12. The method of claim 11 wherein a memory cell comprises a portion of the rail-shaped top conductor, the pillar, and a portion of a rail-shaped bottom conductor disposed below the pillar.

13. The method of claim 12 wherein the memory cell is formed above a substrate, wherein the substrate comprises monocrystalline silicon.

14. The method of claim 1 wherein the dopant gas provides an n-type or p-type dopant.

15. The method of claim 14 wherein the n-type or p-type dopant is phosphorus, boron, arsenic, indium, gallium, or aluminum.

16. The method of claim 15 wherein the dopant gas is $PH_3$, $POCl_3$, $BCl_3$, $B_2H_6$, $AsH_3$, $GaCl$, $GaCl_3$, $Ga(CH_3)_3$, $Al(CH_3)_3$, or $In(H_3)_3$.

17. The method of claim 1, wherein the method for providing a dopant involves flowing the dopant gas, and wherein the temperature during the step of flowing the dopant gas is about 300 degrees C. or greater.

18. A method for forming a monolithic three dimensional memory array, the method comprising:
    a) monolithically forming a first memory level above a substrate by a method comprising:
        i) forming a plurality of first features, each first feature having a top surface and a sidewall;
        ii) depositing first dielectric material to cover the first features;
        iii) etching a plurality of voids in the first dielectric material, wherein a portion of the top surface and a portion of the sidewall of one of the first features are exposed in each of the voids; and
        iv) either a) flowing a dopant gas over the exposed top surface portion and the exposed sidewall portion of each first feature or b) exposing the exposed top surface portion and the exposed sidewall portion of each first feature to a plasma containing the dopant gas; and
    b) monolithically forming a second memory level above the first memory level.

19. The method of claim 18 wherein each of the first features is a pillar comprising semiconductor material.

20. The method of claim 19 wherein each pillar comprises a vertically oriented semiconductor junction diode.

21. The method of claim 20 wherein the voids are trenches, and wherein forming the first memory level further comprises:
   forming a plurality of rail-shaped bottom conductors below the first pillars; and
   forming a plurality of rail-shaped top conductors, each rail-shaped top conductor formed within one of the trenches.

22. The method of claim 21 wherein the first memory level comprises a plurality of first memory cells, each first memory cell comprising one of the pillars, a portion of one of the bottom conductors, and a portion of one of the top conductors.

23. The method of claim 18 wherein the substrate comprises monocrystalline silicon.

24. A method for doping a top heavily doped region of a semiconductor junction diode, the method comprising:
   forming a vertically oriented semiconductor pillar comprising an intrinsic or lightly doped region, the pillar having a top surface and a sidewall;
   depositing dielectric material to cover the pillar;
   etching a void in the dielectric material to expose a portion of the top surface and a portion of the sidewall;
   either a) flowing a dopant gas over the exposed top surface portion and the exposed sidewall portion or b) exposing the exposed top surface portion and the exposed sidewall portion to a plasma containing the dopant gas.

25. The method of claim 24 wherein the dopant gas provides an n-type or p-type dopant, and wherein the pillar comprises a top heavily doped region doped by the n-type or p-type dopant, the top heavily doped region having a first conductivity type.

26. The method of claim 25 wherein the pillar further comprises a bottom heavily doped region having a second conductivity type, the second conductivity type opposite the first.

27. The method of claim 26 wherein the pillar comprises a p-i-n diode, the p-i-n diode comprising the bottom heavily doped region, the intrinsic or lightly doped region, and a top heavily doped region.

28. The method of claim 27 wherein, during the flowing step, the semiconductor material is amorphous.

29. The method of claim 28 further comprising annealing to crystallize the semiconductor material.

30. The method of claim 24 wherein the semiconductor material comprises silicon, germanium, or an alloy of silicon and/or germanium.

31. The method of claim 24 wherein the void is a trench, and further comprising forming a top rail-shaped conductor in the trench.

* * * * *